United States Patent [19]

Saito et al.

[11] Patent Number: 4,719,348

[45] Date of Patent: Jan. 12, 1988

[54] OPTICAL SENSOR HAVING HEATING ELEMENT TO HEAT AMORPHOUS SEMICONDUCTOR FILM

[75] Inventors: Tamio Saito, Tokyo; Hiromi Kobayashi, Ichikawa, both of Japan

[73] Assignee: Kabushiki Kaisha Toshiba, Kawasaki, Japan

[21] Appl. No.: 911,981

[22] Filed: Sep. 26, 1986

[30] Foreign Application Priority Data

Sep. 30, 1985 [JP] Japan .................... 60-216566

[51] Int. Cl.[4] .................... H01J 7/24; H01J 40/14
[52] U.S. Cl. .................... 250/238; 250/211 R; 357/2; 357/30
[58] Field of Search .................... 250/238, 211 R, 211 J, 250/578; 357/2, 28, 30 K

[56] References Cited

U.S. PATENT DOCUMENTS

| | | | |
|---|---|---|---|
| 3,963,920 | 6/1976 | Nanba et al. | 250/238 |
| 4,107,019 | 8/1978 | Takao et al. | 357/28 |
| 4,522,663 | 6/1985 | Ovshinsky et al. | 357/30 K |
| 4,552,824 | 11/1985 | Hirai et al. | 357/2 |

OTHER PUBLICATIONS

"Amorphous Silicon Photoconductive Sensor", T. Kagawa, et al Proceedings of the 13th Conference on Solid State Device, Tokyo, 1981, JJap, vol. 21 (1982), 21-1, pp. 251-256.

"Stability and New Structure in a-Si:H Photoconductive Sensors", N. Nakagawa, et al, Journal of Non-Crystal Solids 59 & 60 (1983), 1199-1202.

"Optically induced conductivity changes in discharge-produced hydrogenated amorphous silicon", Staebler and Wronski, J. Appl. Phys. 51 (6), Jun. 1980.

*Primary Examiner*—Edward P. Westin
*Assistant Examiner*—William L. Oen

[57] ABSTRACT

In an optical sensor, a heating element is formed on a substrate, and an amorphous semiconductor film is formed on an insulating layer covering the heating element, and is electrically insulated from the heating element. A common electrode and a plurality of electrodes are also formed on the substrate and are extended along the amorphous semiconductor film, to form cells for converting light into electrical signals, in the amorphous semiconductor film. An electric current is supplied to the heating element, to heat the amorphous semiconductor film after the film has been illuminated and photoelectric current has been picked up from the electrodes.

8 Claims, 10 Drawing Figures

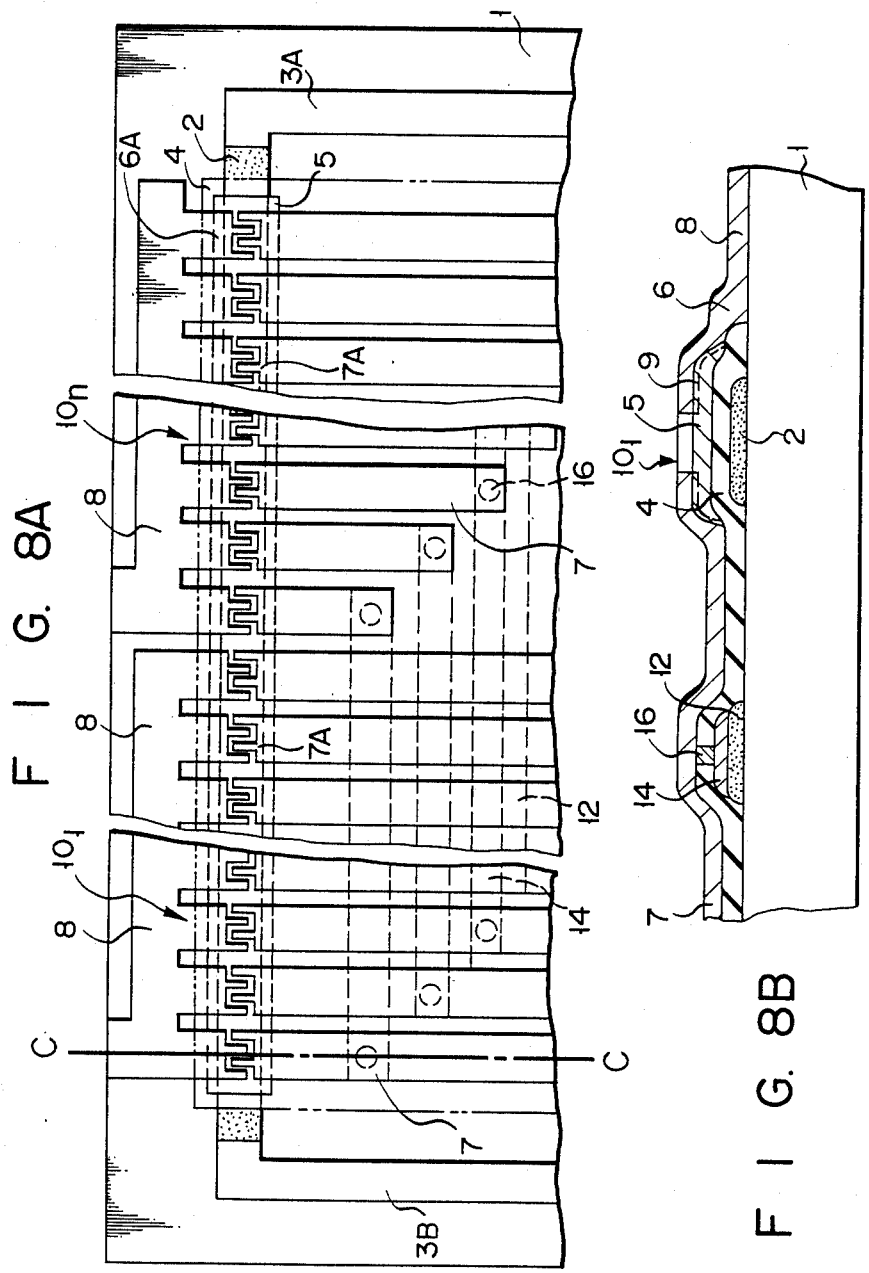

OPTICAL SENSOR HAVING HEATING ELEMENT TO HEAT AMORPHOUS SEMICONDUCTOR FILM

BACKGROUND OF THE INVENTION

The present invention relates to an optical sensor which can be used as, for example, an image sensor, and more particularly to an optical sensor provided with an amorphous film, functioning as a photoconductive film.

Amorphous semiconductor film, a typical example of which is amorphous silicon film, can be deposited on a substrate by means of glow discharge of a gas, such as $SiH_4$, or a combination of $SiH_4$ with $H_2$, $PH_3$, $B_2H_6$ and/or $CH_4$. Further, it can be formed on a large surface area of the substrate. Due to these advantageous features, amorphous semiconductor film has attracted much attention in the art, since it can be used as a photoelectric conversion film in image sensors.

One of the various known optical sensors using amorphous semiconductor films has an electrode placed in ohmic contact with the amorphous semiconductor film. When the film is illuminated, it undergoes photoconduction, and its resistance changes. As a result, the film generates a photo-current, which is supplied as a signal from the electrode. The semiconductor amorphous film and the signal electrode form a photoelectric transducer element, usually called a "cell", of a photosensor. FIG. 1 is a graph illustrating the relationship between the voltage applied to the cell and the photoelectric current generated by the cell, as the amount of light irradiated to the cell is varied. As this figure shows, the greater the amount of light, the higher the resistance of the amorphous semiconductor film. FIG. 2 illustrates the relationship between the luminance on the cell surface and the photoelectric current generated by the cell. As is evident from FIG. 2, the photoelectric current increases as the luminance increases. Hence, a predetermined electric current can be obtained by applying an appropriate voltage to the cell.

It has been ascertained that the longer an amorphous semiconductor film is exposed to light, the higher the resistance the film will have, and hence, the smaller the photoelectric current will become. This phenomenon is known in the as Staebler and Wronski effect. That is, the photo-current gradually decreases as the film is continuously illuminated, even if the luminance (E) remains unchanged, as can be understood from the graph of FIG. 3. The decrease of the photoelectric current, due to this effect, is prominent in proportion to the luminance (E). The amorphous semiconductor film has its photosensitivity sharply reduced in a relatively short time. Therefore, the film cannot be practically used in an optical sensor.

SUMMARY OF THE INVENTION

The object of the present invention is to provide an optical sensor which can compensate for the Staebler and Wronski effect in an amorphous semiconductor film, and which can, therefore, remain highly photosensitive for a long period of time.

According to the present invention, there is provided an optical sensor which comprises a substrate, a heating element formed on the substrate, an insulating layer formed on the heating element, and an amorphous semiconductor film (a photoelectric conversion film) formed on the insulating layer. An electric current is supplied to the heating element, at a predetermined interval, upon lapse of predetermined time after light has been applied to the amorphous semiconductor film, or every time the photoelectric current, generated by the light applied to the film, decreases below a predetermined value. Whenever the heating element is supplied with an electric current, it heats the amorphous semiconductor film, whereby the film deteriorated by the application of light, regains its photoelectric conversion characteristic.

BRIEF DESCRIPTION OF THE DRAWINGS

FIG. 8A is a plane view of an image sensor according to another embodiment of the invention; and FIG. 8B is a cross-sectional view of the image sensor, taken along line C—C in FIG. 8A.

DETAILED DESCRIPTION OF THE PREFERRED EMBODIMENTS

Figure 1:
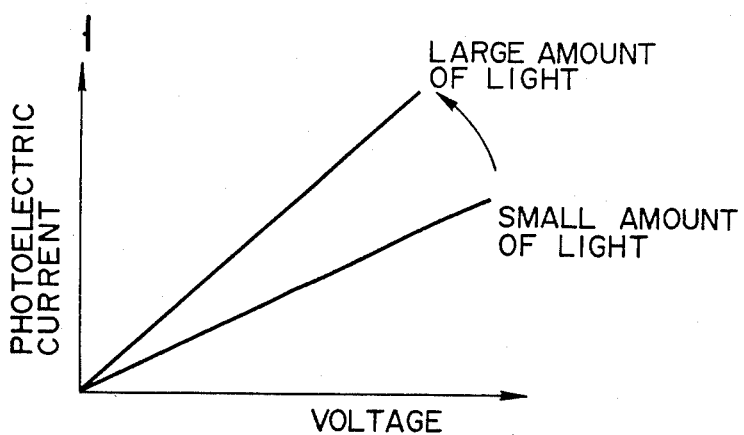
FIG. 1 is a graph showing the relationship between the voltage applied to an optical sensor having an amorphous semiconductor film used as a photoconductive film, and the photoelectric current generated by the optical sensor, when different amounts of light are applied to the optical sensor.
Figure 2:
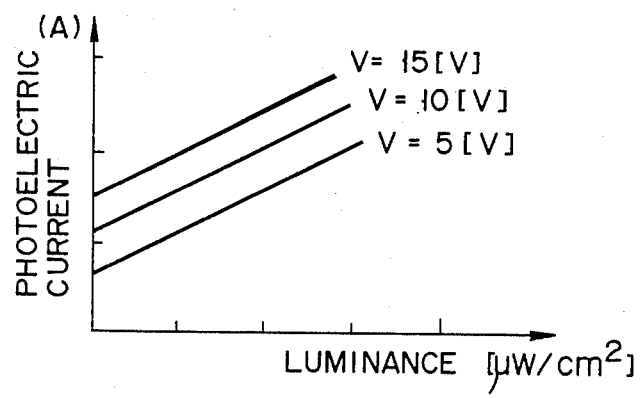
FIG. 2 is a graph representing the relationship between the luminance on the optical sensor and the photoelectric current generated by the sensor, as different voltages are applied to the optical sensor.
Figure 4A:
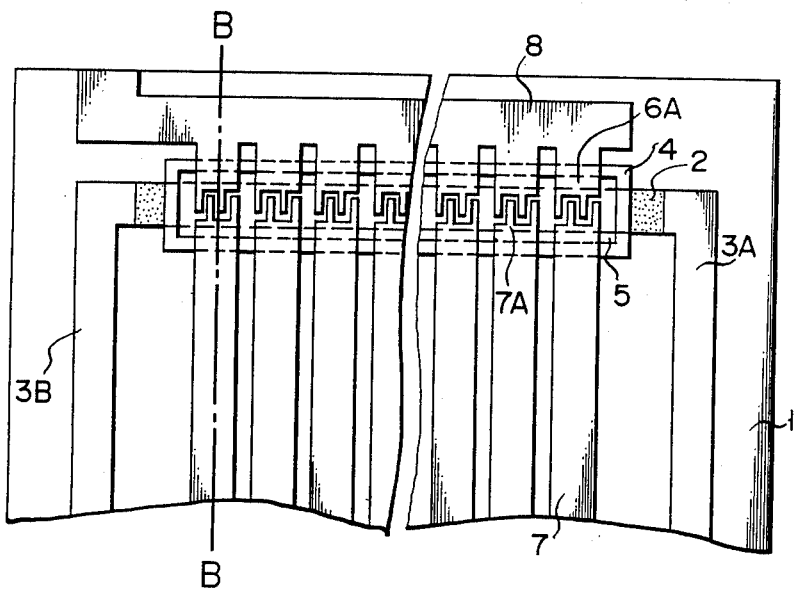
FIG. 4A is a plane view of an image sensor according to one embodiment of the invention.
Figure 4B:
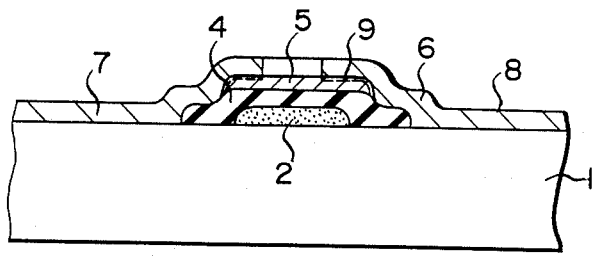
FIG. 4B is a cross-sectional view of the image sensor, taken along line B—B in FIG. 4A.

FIGS. 4A and 4B show a one-dimensional image sensor according to one embodiment of this invention. This image sensor comprises insulative substrate 1 made of glass or ceramic, or comprised of a ceramic plate and a glass layer formed on one surface of the ceramic plate. The sensor further comprises strip-like heating element 2 formed on substrate 1, insulating layer 4 covering heating element 2, and amorphous semiconductor film 5 formed on insulating layer 4 and hence, electrically insulated from heating element 2. Heating element 2 is either a thick resistive member or a thin resistive member of TaSiO, $BaRuO_3$, Poli-Si, $Cr-SiO_2$, Ni-Cr, Ti, W, or Cr, and is electrically connected at one end to currentsupplying electrode 3A and at the other end to currentsupplying electrode 3B. Insulating layer 4 is made of $Ta_2O_5$, $SiO_2$, or Si. Amorphous semiconductor film 5 is made of hydrogenated amorphous silicon (a-Si:H) containing 20% or more of silicon and 10% or more of hydrogen. It is formed by glow-discharging SiH₄, or a combination of SiH₄ with H₂, PH₃, B₂H₆ and/or CH₄ gases, thereby depositing amorphous silicon on insulating layer 4. Common electrode 8 is formed on substrate 1, in the form of a comb. Teeth 8A of interdigitated electrode 8 are juxtaposed, each extending in the width direction of amorphous silicon film 5. A plurality of electrodes 7 are formed on substrate 1. Each of electrodes 7 is also shaped into an interdigitated form and has two teeth 7A. Each of teeth 7A and 8A, and amorphous silicon film 5 form a cell for converting light into an electrical signal. Electrodes 7 and common electrode 8 are made of a metal such as aluminum, titanium, or manganese. A dopant such as di-boran can be doped into those portions of amorphous silicon film 5 which contact teeth 7A and 8A, thereby to form n+ layers 9. When n+ layers 9 are formed in amorphous silicon film 5, the linearity of the voltage-current characteristic (FIG. 2) can be improved. To read an image, electrodes 7 are selectively scanned, and each cell generates a photoelectric current.

Figure 3:
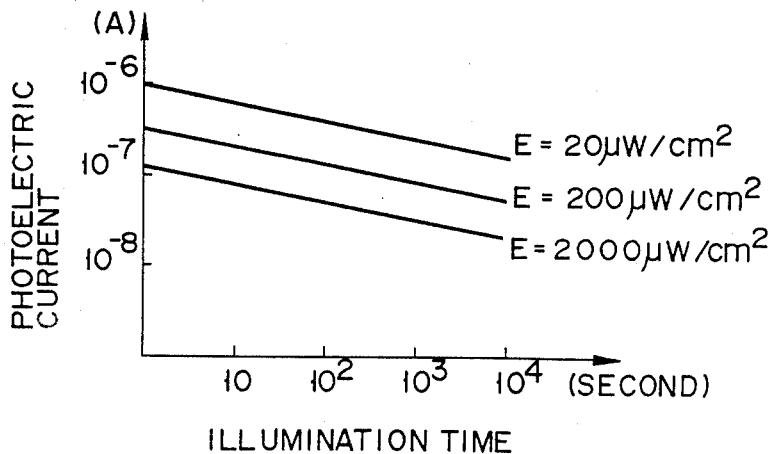
FIG. 3 is a graph illustrating the relationship between the time of applying light to the optical sensor and the photoelectric current generated by the sensor, as the amount of light applied to the sensor is changed.
Figure 5:
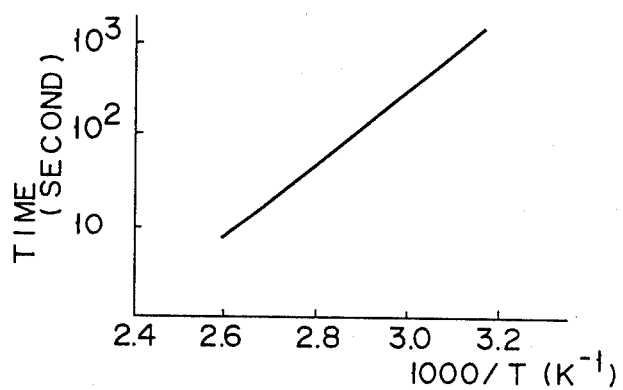
FIG. 5 is a graph representing the relationship between the temperature to which the amorphous semiconductor film of an optical sensor has been heated, and the time which the deteriorated film needs, in order to regain its photoelectric conversion characteristic.

As has been explained with reference to FIG. 3, the longer an amorphous semiconductor film is illuminated, the more its photoelectric conversion characteristic will be deteriorated, and the less photoelectric current it will generate. However, the deteriorated amorphous semiconductor film can regain its photoelectric conversion characteristic when it is heated. The time the film needs to regain its photoelectric conversion characteristic depends on the temperature to which it has been heated, as is illustrated in the graph of FIG. 5. More specifically, as is shown in FIG. 5, the higher the temperature, the shorter the time the film requires to regain its photoelectric conversion characteristic.

Figure 6:
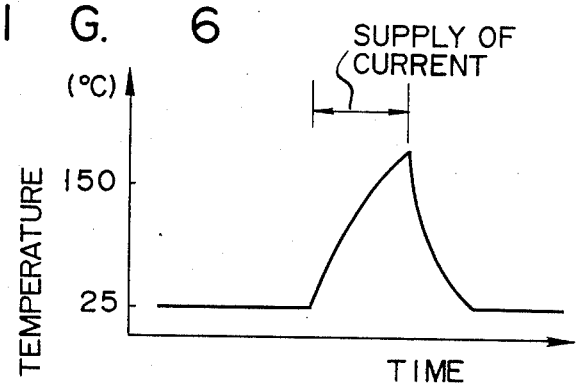
FIG. 6 is a graph showing the relationship between the time of supplying a current to the heating element of the image sensor shown in FIGS. 4A and 4B, and the temperature of the heating element.

The present invention makes full use of the above-mentioned nature of an amorphous semiconductor film. As is shown in FIG. 4A, heating element 2 is formed on substrate 1, in order to heat amorphous semiconductor film 5 formed on insulating layer 4, which in turn is formed on heating element 2. Heating element 2 is a heating resistive member of the type used in a thermal printing head. Its temperature therefore quickly changes, as is indicated in FIG. 6; it can rise quickly to 150° C. or more, a temperature high enough to make amorphous semiconductor film 5 regain its photoelectric conversion characteristic. An electric current is supplied to heating element 2, via electrodes 3A and 3B, after film 5 has been illuminated and a photo-current has been supplied from each cell. Element 2 thus generates heat, thereby heating amorphous semiconductor film 5. Hence, the deteriorated photoelectric conversion characteristic of film 5 can be quickly compensated for every time the cells supply the photoelectric current. This ensures highly reliable image-sensing.

Amorphous semiconductor film 5 need not be heated as frequently as this; it can instead be heated at regular intervals. Alternatively, an electric current can be supplied to heating element 2 only when the output photoelectric current of a reference cell, other than those cells for sensing an image, decreases below a predetermined value. Any of the above methods of heating film 5 can compensate for the deteriorated photoelectric conversion characteristic of film 5, without sacrificing the image-sensing speed of the image sensor.

Figure 7:
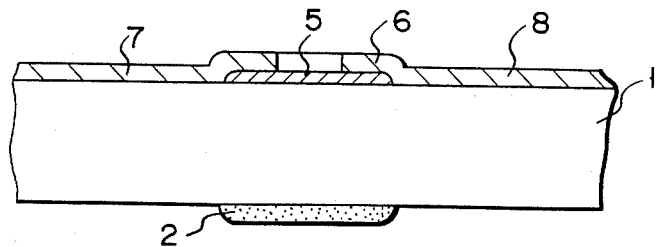
FIG. 7 is a cross-sectional view of an image sensor according to another embodiment of the present invention.

The present invention is not limited to the embodiment described above. For example, as is shown in FIG. 7, heating element 2 can be formed on the surface of insulative substrate 1, opposite to amorphous semiconductor film 5. In this case, substrate 1 functions as a layer which electrically insulates element 2 from film 5. Hence, insulating layer 4 (FIG. 4) can be dispensed with, thus simplifying the structure of the image sensor.

FIGS. 8A and 8B show an optical sensor according to another embodiment of the invention. The sensor shown in FIGS. 8A and 8B is provided with a plurality of sensing areas $10_1$ to $10_n$, each of which has the same structure and arrangement as that of the sensor shown in FIGS. 4A and 4B. In the sensor shown in FIGS. 8A and 8B, one heating element 2 is formed on substrate 1, and extends under sensing areas $10_1$ to $10_n$, and a plurality of adhesion-contact patterns 12 made of a high-resistivity material, the same as that of heating element 2, are also formed on substrate 1. Element 2 and patterns 12 are preferably made of Ti, W, or Cr, and formed at the same time, in the same process. Line electrodes 14 of Au are formed on contact patterns 12, respectively, and are covered by insulating layer 4 having a plurality of through-holes 16 through which line electrodes 14 are electrically connected to corresponding electrodes 7. An electrode cannot be reliably adhered to substrate 1 made of glass or ceramic, but Au electrode can be reliably adhered to a Ti, W, or Cr layer. Accordingly, adhesion-contact patterns 12 are provided on substrate 1.

In the sensor shown in FIGS. 8A and 8B, one of common electrodes 8 and one of electrodes 7 are continuously selected, and a voltage is applied to the selected electrodes 7, 8 from a driver circuit (not shown) via the corresponding pattern 12 when a photo-current, that is, a photo-signal, is picked up from the predetermined sensor cell which is defined by the selected electrodes 7, 8 and a region of film 5 therebetween. An electric current is supplied to heating element 2 via electrodes 3A and 3B, after film 5 has been illuminated and the photo-current has been supplied from each cell.

In the sensor shown in FIGS. 8A and 8B, the sensor can be easily manufactured, even when heating element 2 is formed on substrate 1, because heating element 2 is made of the same material as that of contact patterns 12 and heating element 2, and contact patterns 12 are formed at the same time.

According to the present invention, an optical sensor having high reliability can be realized in a simple structure and into a compact device. Therefore, the optical sensor of the invention can be preferably incorporated in various systems, for example, a facsimile system.

Moreover, various alterations and modifications can be made without departing from the scope and spirit of this invention.

What is claimed is:

1. An optical sensor comprising:
    an insulative substrate having a first surface and a second surface opposing the first surface;
    an amorphous semiconductor film formed on the first surface of the substrate, for converting light rays into electrical signals;
    a first electrode and a second electrode both formed on the amorphous semiconductor film and separated from each other; and
    a heating element formed on either the first or second surface of the substrate, for heating the amorphous semiconductor film, when supplied with an electrical current.

2. The optical sensor according to claim 1, further comprising an insulating layer for electrically insulating the heating element from the amorphous semiconductor film, and wherein said heating element is formed on the first surface of the substrate, said insulating layer is formed partly on the heating element and partly on the substrate, and said amorphous semiconductor film is formed on said insulating layer.

3. The optical sensor according to claim 1, wherein said heating element is formed on the second surface of said substrate and opposing said amorphous semiconductor film.

4. The optical sensor according to claim 1, wherein an electrical current is supplied to said heating element, after light rays have been applied to said amorphous semiconductor film.

5. The optical sensor according to claim 1, wherein an electrical current is supplied to said heating element when a signal current, which said amorphous semiconductor film generates upon receipt of light rays, decreases below a predetermined value.

6. The optical sensor according to claim 1, wherein said heating element is made of high-resistivity material.

7. The optical sensor according to claim 1, further comprising:
- an intermediate layer formed on said substrate;
- a third electrode formed on said intermediate layer and electrically connected to said first electrode; and
- an insulating layer covering said third electrode.

8. The optical sensor according to claim 7, wherein said intermediate layer is made of same material as that of said heating element.

* * * * *